(12) United States Patent
Hai et al.

(10) Patent No.: US 12,069,930 B2
(45) Date of Patent: Aug. 20, 2024

(54) DISPLAY SUBSTRATE INCLUDING TOUCH CONTROL STRUCTURE AND DISPLAY DEVICE

(71) Applicant: BOE Technology Group Co., Ltd., Beijing (CN)

(72) Inventors: Xiaoquan Hai, Beijing (CN); Xue Dong, Beijing (CN); Lei Wang, Beijing (CN); Yingzi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 425 days.

(21) Appl. No.: 17/501,891

(22) Filed: Oct. 14, 2021

(65) Prior Publication Data

US 2022/0271103 A1  Aug. 25, 2022

(30) Foreign Application Priority Data

Feb. 25, 2021  (CN) .......................... 202110211781.9

(51) Int. Cl.
| | |
|---|---|
| *H10K 59/60* | (2023.01) |
| *G06V 40/13* | (2022.01) |
| *H10K 50/86* | (2023.01) |
| *H10K 59/122* | (2023.01) |
| *H10K 59/40* | (2023.01) |

(52) U.S. Cl.
CPC ......... *H10K 59/60* (2023.02); *G06V 40/1318* (2022.01); *H10K 50/865* (2023.02); *H10K 59/122* (2023.02); *H10K 59/40* (2023.02)

(58) Field of Classification Search
CPC ...... H10K 59/60; H10K 50/865; H10K 59/40; H10K 59/38
See application file for complete search history.

(56) References Cited

U.S. PATENT DOCUMENTS

| | | | |
|---|---|---|---|
| 2017/0153753 A1* | 6/2017 | Ishizaki | G06F 3/0445 |
| 2017/0286044 A1* | 10/2017 | Kim | G09G 3/3607 |
| 2018/0019288 A1* | 1/2018 | Yang | H01L 27/1255 |
| 2019/0050621 A1* | 2/2019 | Xu | G06V 40/1318 |
| 2020/0033976 A1* | 1/2020 | Yin | G06F 3/0412 |
| 2020/0105841 A1* | 4/2020 | Bang | H10K 59/60 |
| 2021/0233975 A1* | 7/2021 | Bouthinon | H10K 59/38 |
| 2022/0046813 A1* | 2/2022 | Cheng | H04M 1/0268 |
| 2022/0057873 A1* | 2/2022 | Kubota | H10K 59/65 |
| 2022/0067340 A1* | 3/2022 | Han | H10K 50/865 |

* cited by examiner

*Primary Examiner* — Nduka E Ojeh
(74) *Attorney, Agent, or Firm* — IPro, PLLC

(57) ABSTRACT

The present disclosure discloses a display substrate and a display device. The display substrate includes: a base substrate; a plurality of light emitting devices, located on the base substrate; a plurality of photosensitive devices, located between a layer where the plurality of light emitting devices are located and the base substrate; a plurality of color resistors and a black matrix, located on a side of the layer where the plurality of light emitting devices are located facing away from the base substrate; a touch control structure, located between the layer where the plurality of light emitting devices are located and a layer where the black matrix is located; and an ultrathin glass cover plate, a whole face of which being disposed on a side of the layer where the black matrix is located facing away from the base substrate.

17 Claims, 18 Drawing Sheets

DISPLAY SUBSTRATE INCLUDING TOUCH CONTROL STRUCTURE AND DISPLAY DEVICE

CROSS-REFERENCE TO RELATED APPLICATIONS

The present disclosure claims priority to Chinese patent application No. 202110211781.9, filed with the China National Intellectual Property Administration on Feb. 25, 2021, the content of which is incorporated herein by reference in its entirety.

FIELD

The present disclosure relates to the technical field of display, and particularly to a display substrate and a display device.

BACKGROUND

With constant development of a terminal technology, electronic equipment has been applied more and more widely. In order to protect information security of a user, use of a fingerprint recognition function on the electronic equipment becomes more and more common, for example, use of the fingerprint recognition function in mobile phone unlocking, mobile payment (such as payment, transfer) or the like.

Optical fingerprint recognition is one of means for realizing fingerprint recognition. A principle of the optical fingerprint recognition is as follows: when a finger is placed above a display product, emitted light rays of a light source included in the display product are irradiated to valleys and ridges of the finger, reflected by the valleys and the ridges of the finger, and then are incident on an optical fingerprint recognition device included in the display product. Because light intensities reflected by the valleys are different from light intensities reflected by the ridges, the fingerprint recognition device generates different electric signals according to differences of the above reflected light intensities between the valleys and the ridges so as to realize the fingerprint recognition.

SUMMARY

Embodiments of the present disclosure provide a display substrate and a display device.

An embodiment of the present disclosure provides a display substrate, including: a base substrate; a plurality of light emitting devices, located on the base substrate; a plurality of photosensitive devices, located between a layer where the plurality of light emitting devices are located and the base substrate, where an orthographic projection of each of the photosensitive devices on the base substrate is located at a gap between orthographic projections of adjacent light emitting devices on the base substrate; a plurality of color resistors and a black matrix, located on a side of the layer where the plurality of light emitting devices are located facing away from the base substrate, where the black matrix has a plurality of first openings and a plurality of second openings, the plurality of color resistors are correspondingly disposed in the plurality of first openings and cover the plurality of light emitting devices, and orthographic projections of the plurality of second openings on the base substrate mutually overlap with the orthographic projections of the plurality of photosensitive devices on the base substrate; a touch control structure, located between the layer where the plurality of light emitting devices are located and a layer where the black matrix is located, where an orthographic projection of the touch control structure on the base substrate is located in an orthographic projection of the black matrix on the base substrate, and the orthographic projection of the touch control structure on the base substrate does not overlap with the orthographic projections of the second openings on the base substrate; and an ultrathin glass cover plate, a whole face of which being disposed on a side of the layer where the black matrix is located facing away from the base substrate.

An embodiment of the present disclosure provides a display device, including the above display substrate.

DETAILED DESCRIPTION

Figure 1:
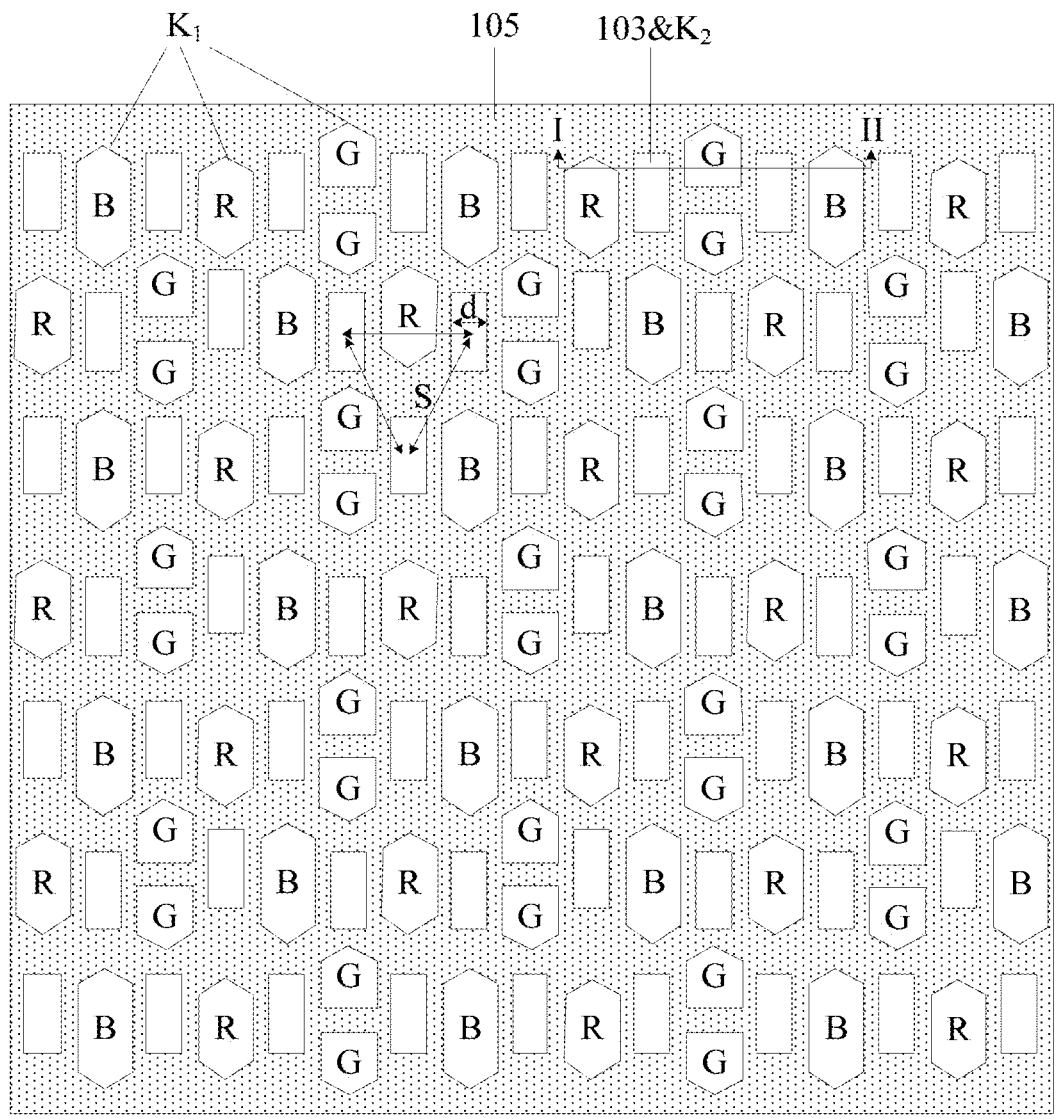
FIG. 1 is a schematic structural diagram of a display substrate provided by an embodiment of the present disclosure.

In order to make the objectives, technical solutions and advantages of embodiments of the present disclosure more clear, the technical solutions of embodiments of the present disclosure will be described clearly and completely with reference to the drawings of embodiments of the present disclosure. It should be noted that the size and shapes of all graphs in the drawings do not reflect the true scale, and only intend to illustrate the content of the present disclosure. The same or similar reference numbers represent the same or similar elements or elements with the same or similar functions from beginning to end. It is apparent that the described embodiments are part of embodiments of the present disclosure, but not all embodiments. On the basis of the described embodiments of the present disclosure, all other embodiments obtained by those ordinarily skilled in the art without inventive efforts fall within the protection scope of the present disclosure.

Unless otherwise defined, the technical or scientific terms used here should have the usual meanings understood by those ordinarily skilled in the art to which the present disclosure belongs. The words "first", "second" and the like used in the specifications of the present disclosure and the claim do not indicate any order, quantity or importance, but are only used to distinguish different components. The word "including" or "comprising" and the like, means that an element or item preceding the word includes an element or item listed after the word and the equivalent thereof, without excluding other elements or items. The words "inner", "outer", "upper", "lower" and the like are only used to indicate the relative positional relationship. When the absolute position of the described object changes, the relative positional relationship may also change accordingly.

In order to keep the following descriptions of embodiments of the present disclosure clear and concise, the present disclosure omits detailed descriptions of known functions and known parts.

In an Organic Light-Emitting Diode (OLED) display screen, a solution of direct Color Film On Encapsulation (COE) may utilize a color film to replace a polarizer, so that the OLED display screen has characteristics of being higher in integration level, lighter and thinner, and higher in transmissivity, compared with a product adopting the polarizer, power consumption of the display screen can be reduced by about 20%, the life can be prolonged by about 40%, and the OLED display screen is more applicable to a 5G product with high rate and low delay.

A display device of In Cell fingerprint recognition based on a COE technology sequentially includes a base substrate, a drive circuit layer, a layer where a photosensitive device is located, a layer where a light emitting device is located, an encapsulation layer, a touch control layer, a color film layer and a common glass cover plate from bottom to top. The color film includes a color resistor located over the light emitting device, and a Black Matrix (BM) located over the photosensitive device and the touch control layer, and the touch control layer is generally made of metal; and existence of the touch control layer and the black matrix leads to substantial reducing of light transmittance of the OLED display screen, and the photosensitive device cannot perceive a clear fingerprint signal. In addition, a foldable screen is a development trend of a future product. However, the common glass cover plate is large in rigidity, which is not conductive to meeting a folding requirement.

Figure 2:
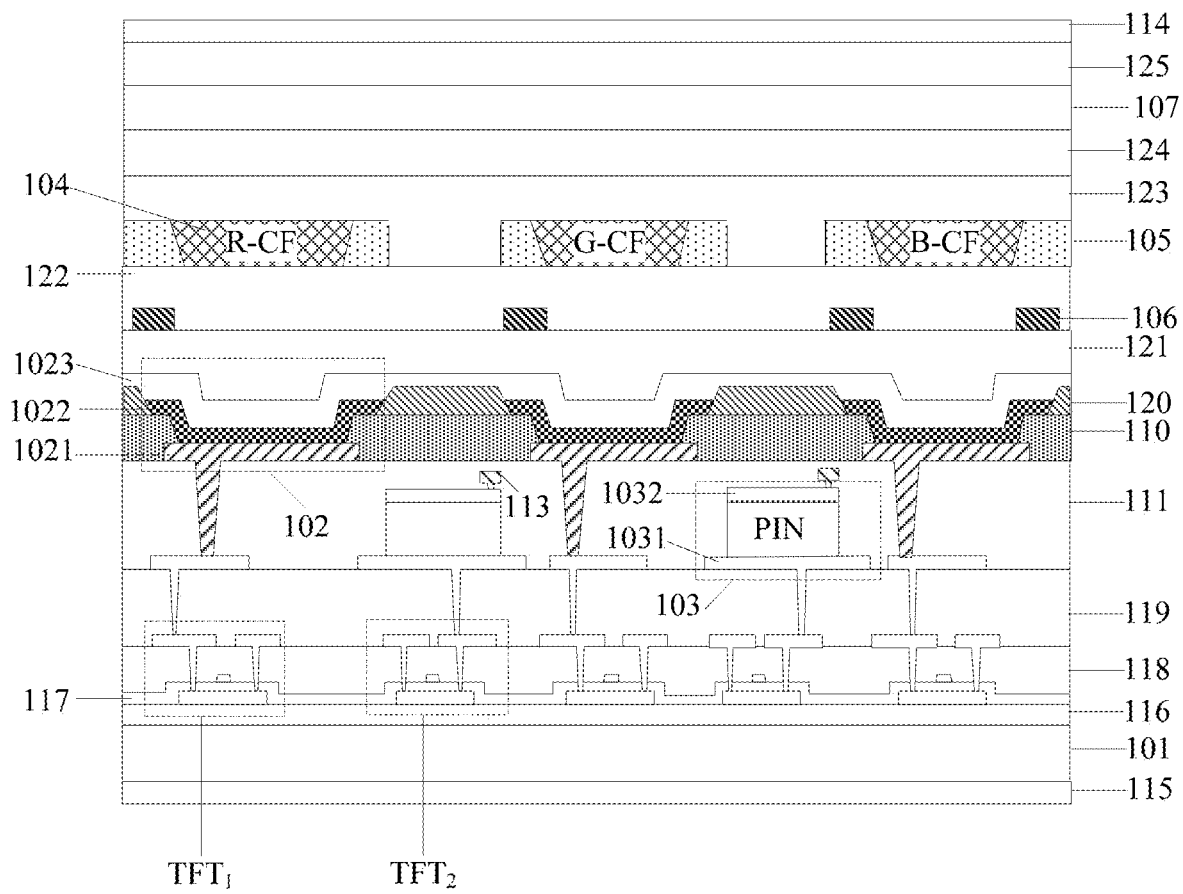
FIG. 2 is a schematic diagram of a sectional structure along a line I-II in FIG. 1.

In order to at least solve the above problem existing in the related art, an embodiment of the present disclosure provides a display substrate, as shown in FIG. 1 and FIG. 2, including: a base substrate 101; a plurality of light emitting devices 102, located on the base substrate 101; a plurality of photosensitive devices 103, located between a layer where the plurality of light emitting devices 102 are located and the base substrate 101, where an orthographic projection of each of the photosensitive devices 103 on the base substrate 101 is located at a gap between orthographic projections of adjacent light emitting devices 102 on the base substrate 101; a plurality of color resistors 104 and a black matrix 105, located on a side of the layer where the plurality of light emitting devices 102 are located facing away from the base substrate 101, where the black matrix 105 has a plurality of first openings $K_1$ and a plurality of second openings $K_2$, the plurality of color resistors 104 are correspondingly disposed in the plurality of first openings $K_1$ and cover the plurality of light emitting devices 102, and orthographic projections of the plurality of second openings $K_2$ on the base substrate 101 mutually overlap with the orthographic projections of the plurality of photosensitive devices 103 on the base substrate 101; a touch control structure 106, located between the layer where the plurality of light emitting devices 102 are located and a layer where the black matrix 105 is located, where an orthographic projection of the touch control structure 106 on the base substrate 101 is located in an orthographic projection of the black matrix 105 on the base substrate 101, and the orthographic projection of the touch control structure 106 on the base substrate 101 does not overlap with the orthographic projections of the second openings $K_2$ on the base substrate 101; and an ultrathin glass cover plate 107, a whole face of which being disposed on a side of the layer where the black matrix 105 is located facing away from the base substrate 101.

In the above display substrate provided by an embodiment of the present disclosure, by disposing the second openings $K_2$ mutually overlapping with the photosensitive devices 103 in the black matrix 105 and disposing the touch control structure 106 to keep away from the second openings $K_2$, the black matrix 105 and the touch control structure 106 are prevented from shielding light rays reflected by a fingerprint, thereby effectively improving transmissivity of the light rays reflected by the fingerprint, and significantly improving definition of fingerprint recognition. In addition, the display substrate provided by the present disclosure carries the ultrathin glass cover plate 107. The ultrathin glass cover plate 107 keeps characteristics of glass and meanwhile has good flexibility, and therefore, the requirement of a folding product can be met completely.

In some embodiments, ultrathin glass (UTG) refers to a glass layer with a thickness magnitude being dozens of microns or below, and the ultrathin glass may be bent and deformed, and may be folded. In the present disclosure, a thickness of the ultrathin glass cover plate 107 is about 50 μm. Compared with a polymer plastic film, the ultrathin glass can effectively avoid screen damage, and can also provide better optical definition; meanwhile, the ultrathin glass is not prone to having creases, and good in reliability; and the ultrathin glass is not degraded naturally just like plastic, is long in life, and thus can provide more stable and more reliable protection for the display screen.

In addition, in the present disclosure, the touch control structure 106 is internally disposed, and a touch control module (TSP) does not need to be externally hung, so that a thickness of the display screen can be reduced, folding is further facilitated, a fitting tolerance is avoided, and a border width can be reduced.

In some embodiments, as shown in FIG. 2, each of the light emitting devices 102 may include a first electrode 1021, a light emitting functional layer 1022 and a second electrode 1023, where the light emitting functional layer 1022 includes but not limited to a hole injection layer, a hole transport layer, an electron blocking layer, a light emitting material layer, a hole blocking layer, an electron transport layer and an electron injection layer. In some embodiments, the light emitting functional layer 1022 may be a red light emitting functional layer, a green light emitting functional layer or a blue light emitting functional layer. Accordingly, the color resistors 104 may include a red color resistor R-CF, a green color resistor G-CF and a blue color resistor B-CF. In addition, each of the photosensitive devices 103 may include a bottom electrode 1031, a top electrode 1032 and a PIN structure located between the bottom electrode 1031 and the top electrode 1032. The PIN structure may include a P-type semiconductor layer, an intrinsic semiconductor layer I and an N-type semiconductor layer, where the P-type semiconductor layer is located between the bottom electrode 1031 and the intrinsic semiconductor layer I, and the N-type semiconductor layer is located between the intrinsic semiconductor layer I and the top electrode 1032; or the N-type semiconductor layer is located between the bottom electrode 1031 and the intrinsic semiconductor layer I, and the P-type semiconductor layer is located between intrinsic semiconductor layer I and the top electrode 1032.

Figure 3:
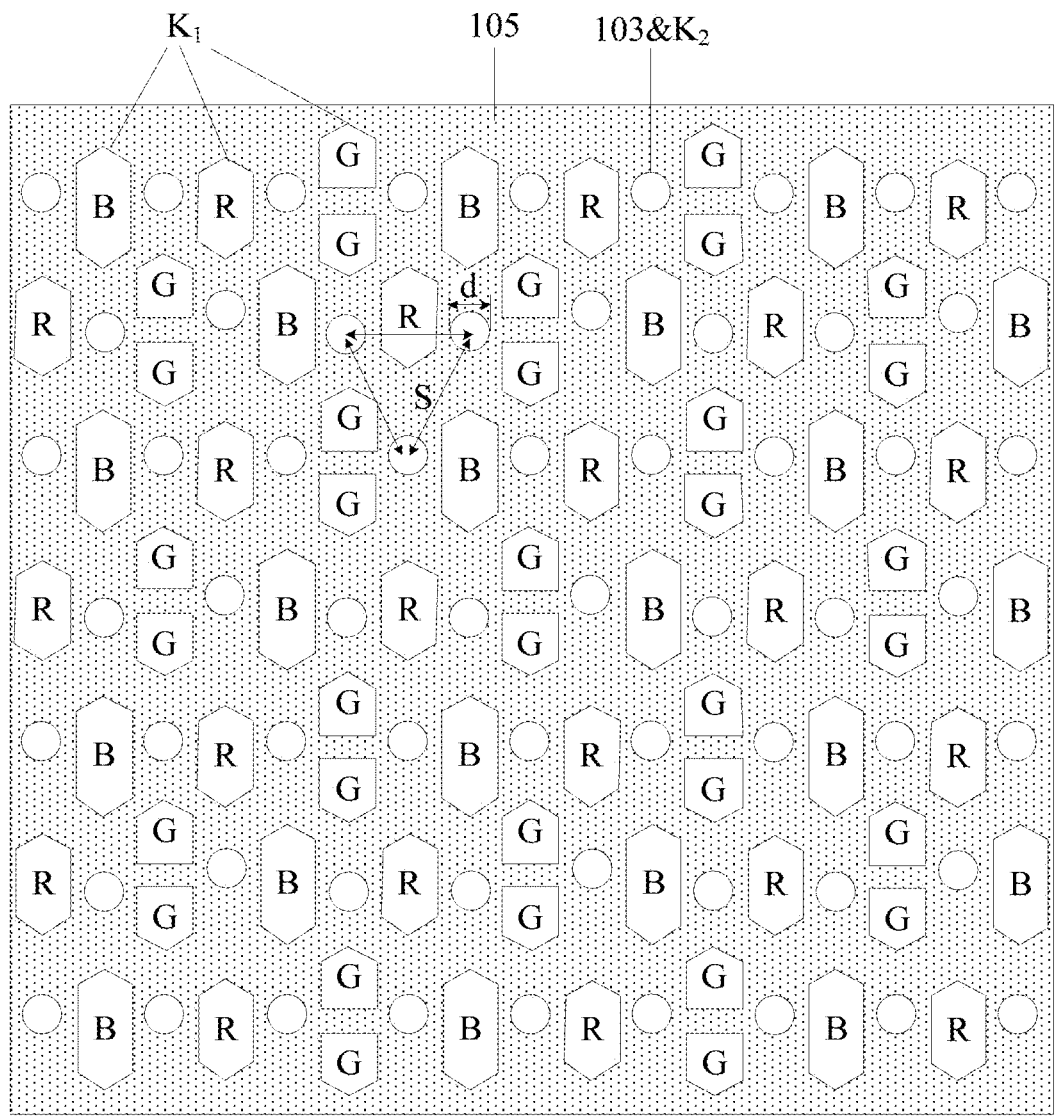
FIG. 3 is another schematic structural diagram of a display substrate provided by an embodiment of the present disclosure.
Figure 4:
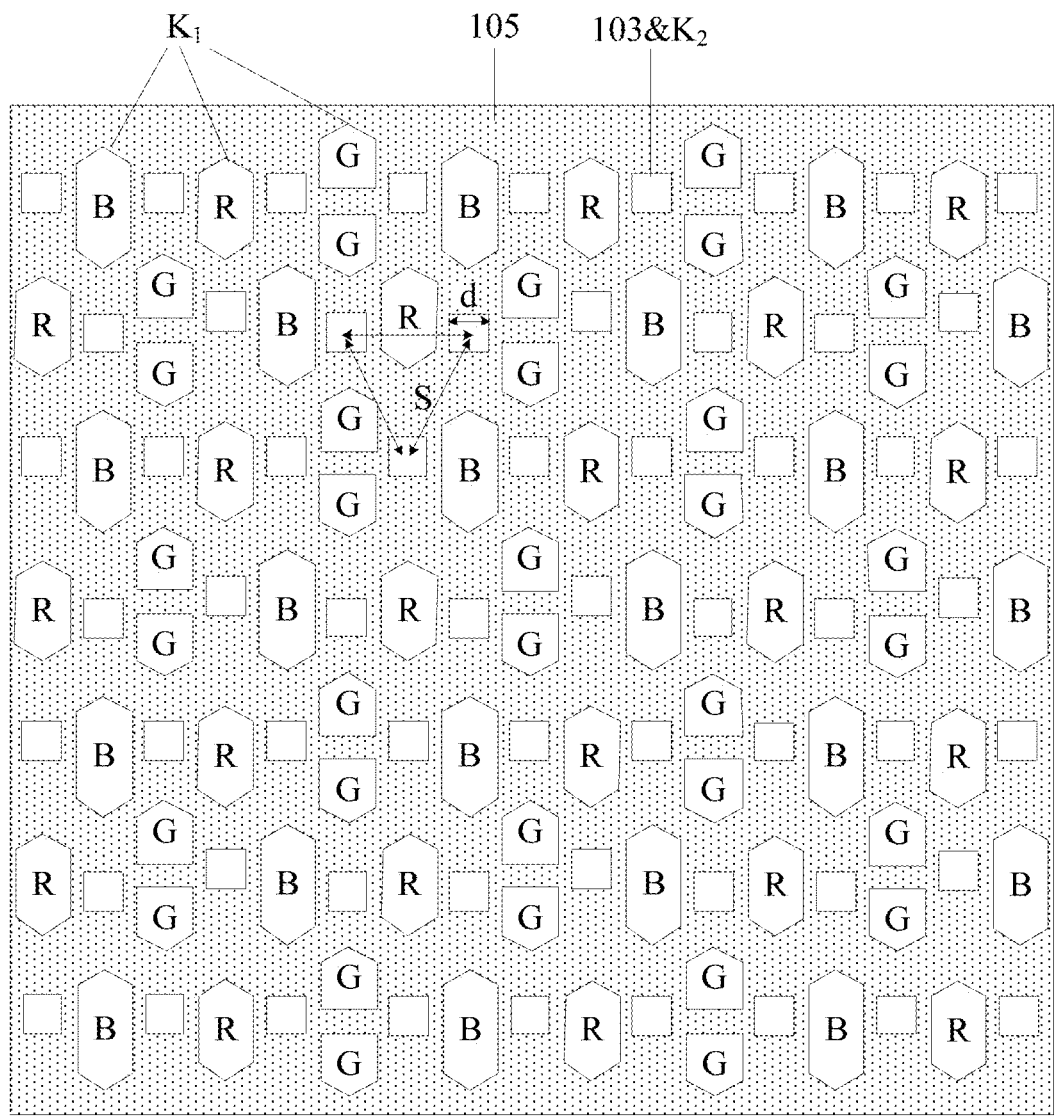
FIG. 4 is yet another schematic structural diagram of a display substrate provided by an embodiment of the present disclosure.

It should be noted that in the present disclosure, the color resistors 104 are located over the light emitting devices 102, and the black matrix 105 is located over a gap between the light emitting devices 102. FIG. 1 only schematically gives an arrangement mode (equivalent to an arrangement mode of the light emitting devices 102) of the color resistors 104, and in some embodiments, it may further be other arrangement modes known by those skilled in the art, which is not limited here. In addition, FIG. 1 only shows that column gaps of the light emitting devices 102 have the photosensitive devices 103 (corresponding to positions of the second openings $K_2$), and in some embodiments, the photosensitive devices 103 may further be disposed at the column gaps of the light emitting devices 102. In addition, in the present disclosure, a shape of each of the second openings $K_2$ may be a rectangle as shown in FIG. 1, a circle as shown in FIG. 3 or a square as shown in FIG. 4, and certainly may also be other shapes (for example, an equilateral polygon), which is not limited here.

Figure 5:
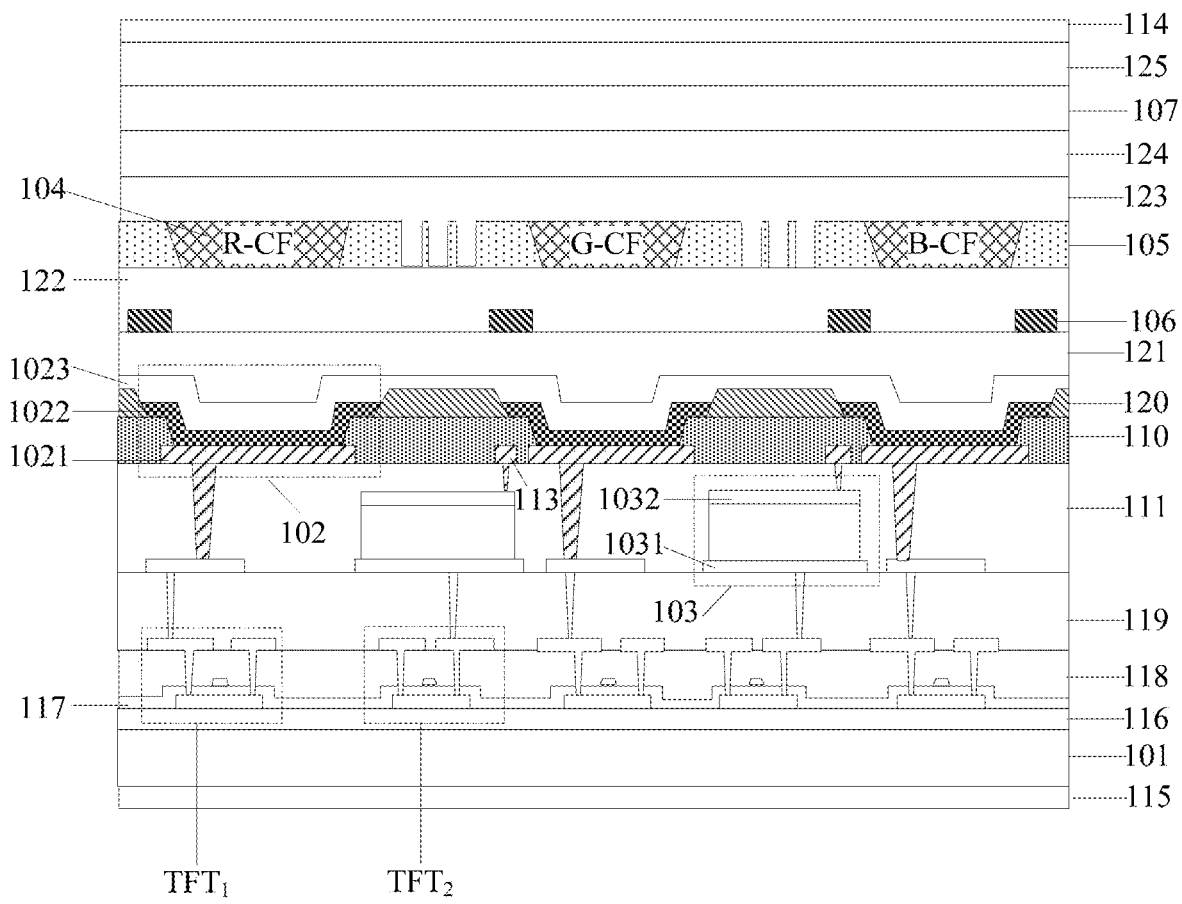
FIG. 5 is a schematic diagram of another sectional structure along a line I-II in FIG. 1.
Figure 6:
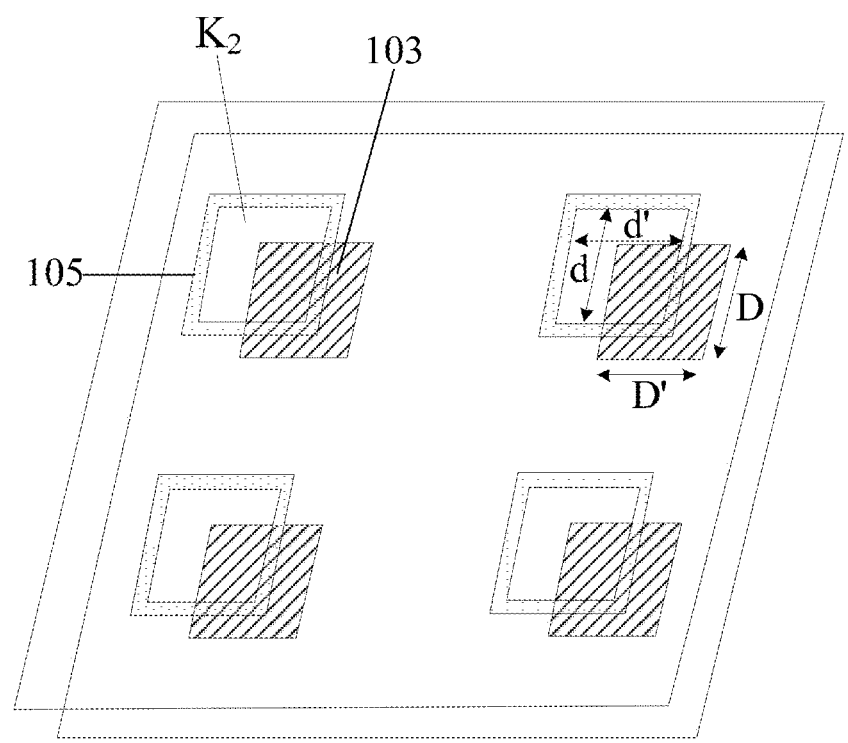
FIG. 6 is a spatial position relationship diagram of a second opening of a black matrix and a photosensitive device provided by an embodiment of the present disclosure.

Optionally, in the above display substrate provided by an embodiment of the present disclosure, as shown in FIG. 2 and FIG. 5, at least one of the second openings $K_2$ and one of the photosensitive devices 103 are correspondingly disposed. That is, one or more second openings $K_2$ may be formed over one photosensitive device 103, so that the light transmittance at the position where each of the photosensitive devices 103 is located increases due to the second openings $K_2$, thereby improving a fingerprint recognition effect.

Optionally, in the above display substrate provided by an embodiment of the present disclosure, as shown in FIGS. 1-4 and FIG. 6, one of the second openings $K_2$ and one of the photosensitive devices 103 are correspondingly disposed, and the orthographic projection of the one of the second openings $K_2$ on the base substrate 101 completely coincides with the orthographic projection of the corresponding one of the photosensitive devices 103 on the base substrate 101. For example, in FIG. 6, taking an example that each of the shape of each of the second openings $K_2$ and the shape of each of the photosensitive devices 103 is a rectangle, a first side length d of each of the second openings $K_2$ is equal to a first side length D of each of the photosensitive devices 103, and a second side length d' of each of the second openings $K_2$ is equal to a second side length D' of each of the photosensitive devices 103. In some embodiments, each of the second openings $K_2$ is a square, and thus d is equal to d'; and accordingly, each of the photosensitive devices 103 is a square, and thus D is equal to D'. The photosensitive devices 103 may convert received light rays into electric signals so as to realize the fingerprint recognition function. By forming one of the second openings $K_2$ with the size being roughly the same as the size of the corresponding one of the photosensitive devices 103 over the corresponding one of the photosensitive devices 103, an upper surface of the corresponding one of the photosensitive devices 103 may be completely irradiated by the light rays transmitted by the one of the second openings $K_2$, thereby increasing a utilization rate of the corresponding one of the photosensitive devices 103, and ensuring accuracy of fingerprint recognition.

Figure 7:
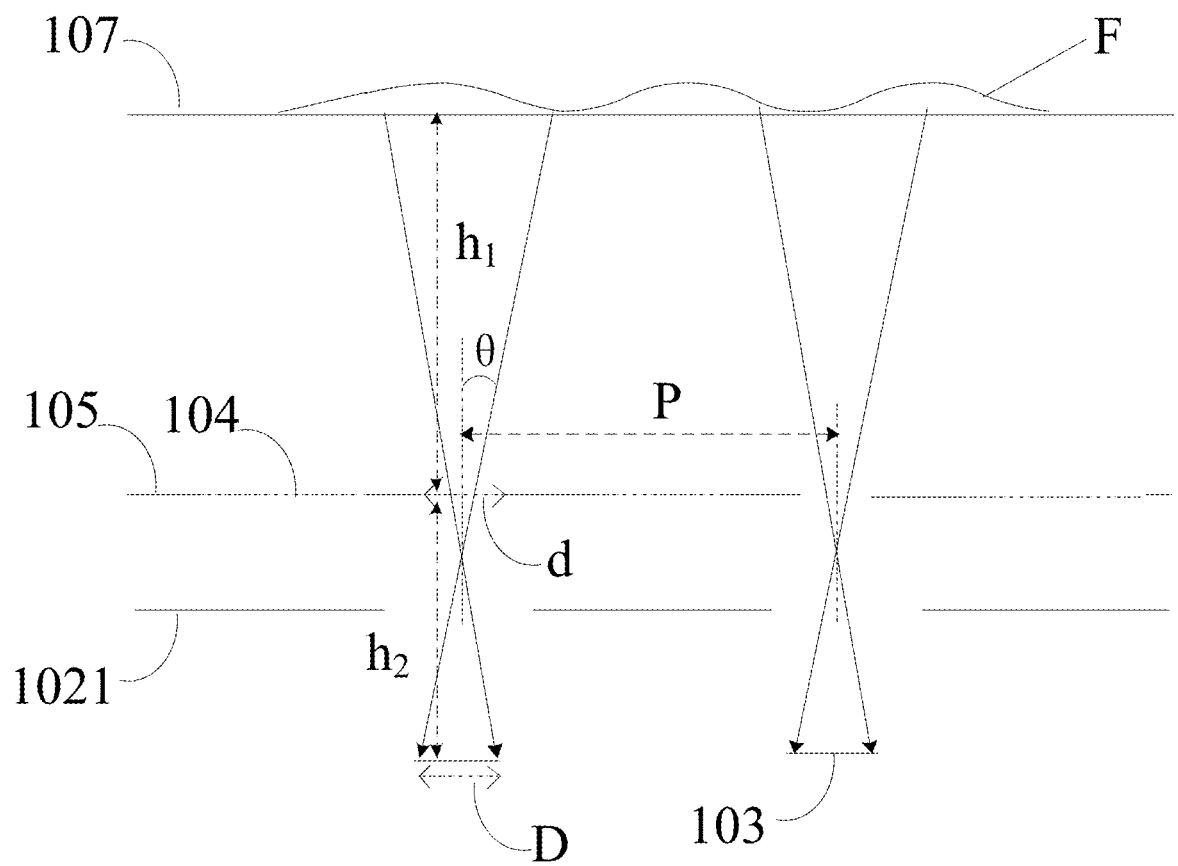
FIG. 7 is a principle diagram of fingerprint imaging provided by an embodiment of the present disclosure.

Optionally, in the above display substrate provided by an embodiment of the present disclosure, as shown in FIG. 7, on the basis that the size of the corresponding one of the photosensitive devices 103 is roughly the same as the size of the one of the second openings $K_2$, taking an example that the shape of the one of the second openings $K_2$ is a circle or the square, a light receiving angle θ determined by the black matrix 105 meets the following relationship: $\tan θ = d/h_2 = P_x/(2h_1)$, where d is a pore diameter or the side length of the one of the second openings $K_2$ and d=D (namely, a pore diameter or the side length of the corresponding one of the photosensitive devices 103), $h_1$ is a distance between the ultrathin glass cover plate 107 and the layer where the black matrix 105 is located, $h_2$ is a distance between the layer where the black matrix 102 is located and the layer where the photosensitive devices 103 are located, and $P_x$ is a distance between adjacent ridges or adjacent valleys of the fingerprint. A collimation function may be formed between the one of the second openings $K_2$ and the corresponding one of the photosensitive devices meeting a relational expression.

Optionally, in the above display substrate provided by an embodiment of the present disclosure, in order to obtain a good collimation effect, a value of d may be in a range of 8 μm to 20 μm, for example, 8 μm, 10 μm, 15 μm, 20 μm, etc; a value of $h_1$ may be in a range of 50 μm to 200 μm, for example, 50 μm, 80 μm, 100 μm, 120 μm, 150 μm, and 200 μm; a value of $h_2$ may be in a range of 8 μm to 20 μm, for example, 8 μm, 10 μm, 12 μm, 15 μm, 18 μm, 20 μm, etc; and a value of $P_x$ is generally in a range of 300 μm to 500 μm, for example, 300 μm, 350 μm, 400 μm, 450 μm, 500 μm, etc, and thus a value of 0 may be in a range of 30° to 50°, for example, 45°.

Optionally, in the above display substrate provided by an embodiment of the present disclosure, in order to improve the collimation effect, as shown in FIG. 1, FIG. 3 and FIG. 4, a distance S between centers of any two adjacent second openings $K_2$ is the same. According to a process manufacturing capacity, a value of S may be in a range of 20 μm to 80 μm, for example, 20 μm, 30 μm, 40 μm, 50 μm, 60 μm, 70 μm, 80 μm, etc.

Figure 8:
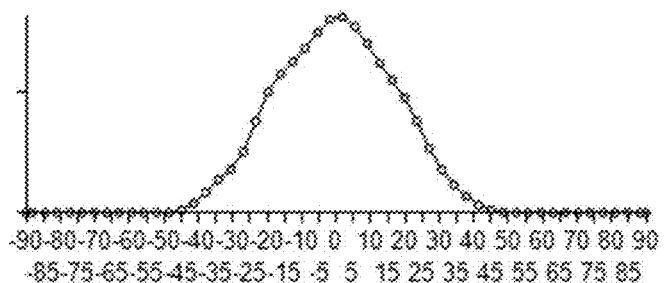
FIG. 8 is an evaluation diagram of optical characteristic simulation provided by an embodiment of the present disclosure.
Figure 9:
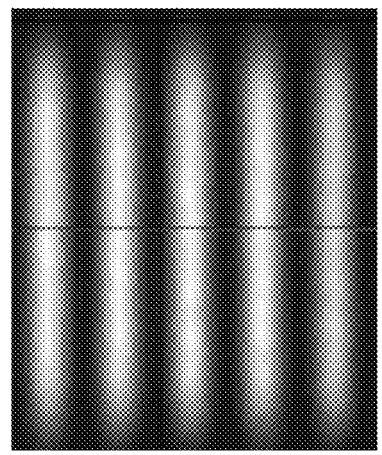
FIG. 9 is an evaluation diagram of fingerprint imaging simulation provided by an embodiment of the present disclosure.

An embodiment is given below to illustrate feasibility of the solution. In an embodiment, $h_1$ is 135 μm, $h_2$ is 15 μm, S is 60 μm, D is equal to d and is 15 μm, and as calculated by the above formula, the light receiving angle θ is +/−45°. The above parameters are subjected to optical simulation verification, and the result is as shown in FIG. 8 and FIG. 9. It can be seen from an optical simulation diagram as shown in FIG. 8, the second openings $K_2$ only allow the light rays with the number of degrees of the collimation light receiving angle θ within the range of +/−45° to pass through. FIG. 9 is an evaluation diagram of fingerprint imaging simulation, it can be seen that the second openings $K_2$ may screen out the small-angle light rays in a mode of being close to collimation, thus the light rays reach a fingerprint recognition device below, each beam of light rays screened out may correspond to the valleys and the ridges of the fingerprint one to one, crosstalk of other stray light is avoided, and the fingerprint may be recognized precisely.

Figure 10:
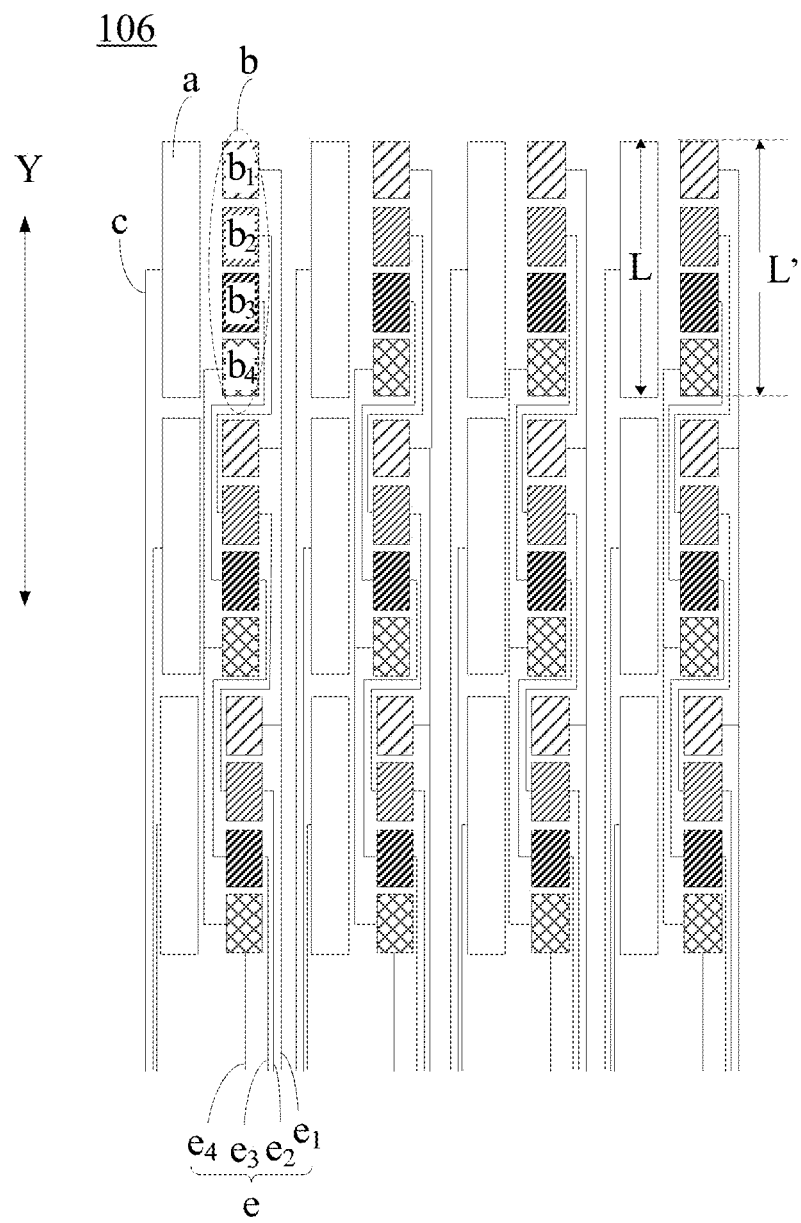
FIG. 10 is a schematic structural diagram of a touch control structure provided by an embodiment of the present disclosure.

Optionally, in the above display substrate provided by an embodiment of the present disclosure, as shown in FIG. 10, the touch control structure 106 may include: a plurality of first touch control electrodes a arranged in an array, a plurality of second touch control electrode groups b arranged in an array, a plurality of first touch control lines c electrically connected with the plurality of first touch control electrodes a, and a plurality of second touch control lines e electrically connected with the plurality of second touch control electrode groups b.

The plurality of first touch control electrodes a, the plurality of second touch control electrode groups b, the plurality of first touch control lines c and the plurality of second touch control lines e are disposed on a same layer.

Each column of the first touch control electrodes a and each column of the second touch control electrode groups b are alternately disposed, and a length L of each of the first touch control electrodes a in a column direction Y is equal to a length L' of each of the second touch control electrode groups b in the column direction Y.

The plurality of first touch control lines c are located on a same side (for example, a left side as shown in FIG. 10) of the first touch control electrodes a in the column direction, and each of the first touch control lines c is electrically connected with one of the first touch control electrodes a.

The plurality of second touch control lines e are located on two sides (for example, the left side and a right side as shown in FIG. 10) of the second touch control electrode groups b in the column direction Y and in a gap of adjacent second touch control electrode groups b in the column direction Y, and the plurality of second touch control lines e include a plurality of first sub touch control lines $e_1$, a plurality of second sub touch control lines $e_2$, a plurality of third sub touch control lines $e_3$ and a plurality of fourth sub touch control lines $e_4$.

Each of the second touch control electrode groups b includes a first sub touch control electrode $b_1$, a second sub touch control electrode $b_2$, a third sub touch control electrode $b_3$ and a fourth sub touch control electrode $b_4$ arranged sequentially in the column direction Y, adjacent first sub touch control electrodes $b_1$ in a column of the second touch control electrode groups b are electrically connected through one of the first sub touch control lines $e_1$, adjacent second sub touch control electrodes $b_2$ in a column of the second touch control electrode groups b are electrically connected through one of the second sub touch control lines $e_2$, adjacent third sub touch control electrodes $b_3$ in a column of the second touch control electrode groups b are electrically connected through one of the third sub touch control lines $e_3$, and adjacent fourth sub touch control electrodes $b_4$ in a column of the second touch control electrode groups b are electrically connected through one of the fourth sub touch control lines $e_4$.

The above touch control structure 106 provided by the present disclosure can realize a self-capacitance touch control mode and a mutual-capacitance touch control mode. Furthermore, the plurality of first touch control electrodes a, the plurality of second touch control electrode groups b, the plurality of first touch control lines c and the plurality of second touch control lines e are disposed on the same layer, the touch control structure 106 may be manufactured only by a mask process, thereby reducing a manufacturing cost and shortening a manufacturing time, and solving the problem that a product yield is decreased due to the excessive mask process.

In some embodiments, when one of the first touch control electrode a and the second touch control electrode group b loads a scanning signal to serve as a touch control drive electrode ($T_x$), and the other is grounded to serve as a touch control inducting electrode ($R_x$), the touch control structure 106 is a mutual-capacitance touch control module and may recognize multiple-point touch control; and when the first touch control electrode a and the second touch control electrode group b both load the scanning signal, the touch control structure 106 is a self-capacitance touch control module and may recognize single-point touch control. In some embodiments, under control of a touch control chip, the touch control structure 106 may be flexibly switched between the self-capacitance touch control mode and the mutual-capacitance touch control mode at any time. Furthermore, a four-channel disposing mode of each of the above second touch control electrode groups b provided by the present disclosure may better recognize a touch control position.

Figure 11:
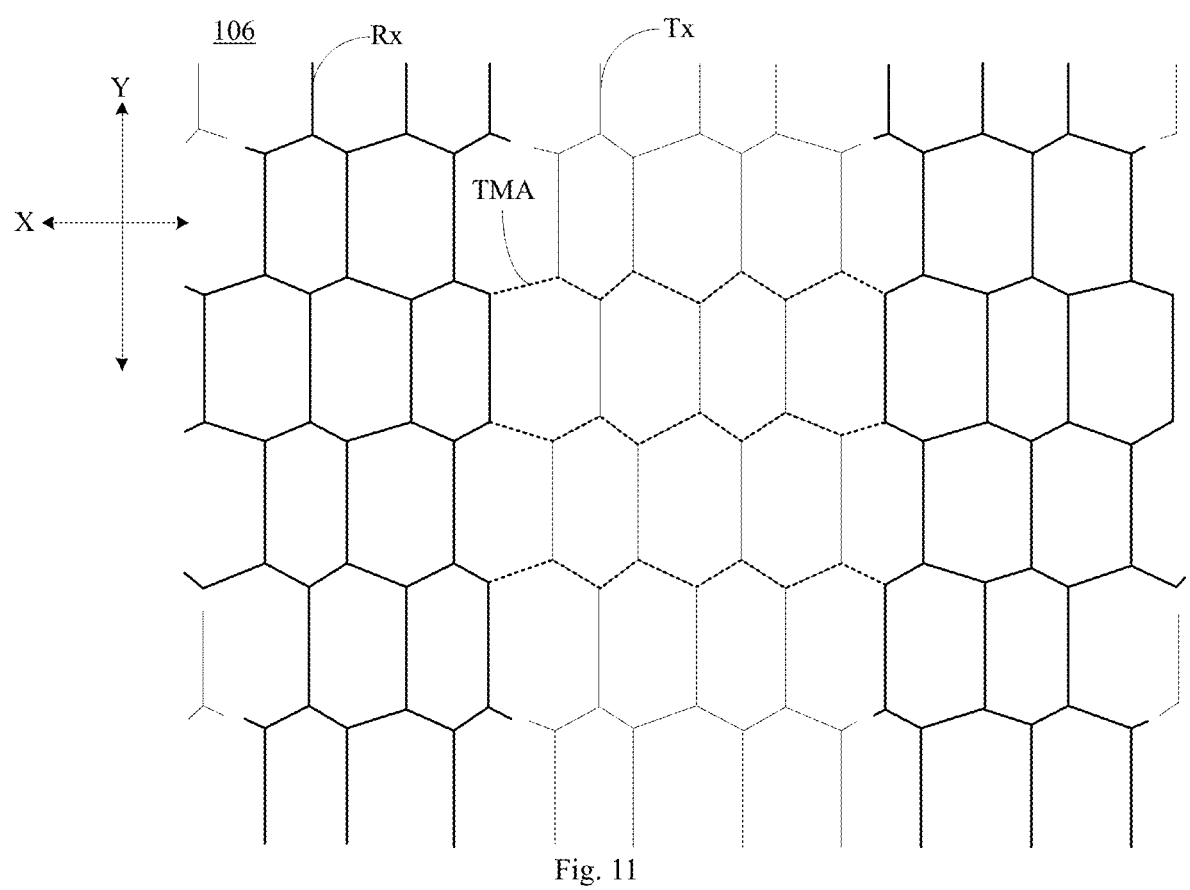
FIG. 11 is another schematic structural diagram of a touch control structure provided by an embodiment of the present disclosure.

Optionally, in the above display substrate provided by an embodiment of the present disclosure, as shown in FIG. 11, the touch control structure 106 may include a third touch control electrode $T_x$ extending in a column direction Y, and a fourth touch control electrode $R_x$ extending in a row direction X, where the third touch control electrode $T_x$ and the fourth touch control electrode $R_x$ are in a grid shape, and the third touch control electrode $T_x$ and the fourth touch control electrode $R_x$ are disposed on a same layer. In order to avoid a short circuit between the third touch control electrode $T_x$ and the fourth touch control electrode $R_x$ disposed on the same layer, any one of the third touch control electrode $T_x$ and the fourth touch control electrode $R_x$ may be connected through a bridging layer TMA, and the bridging layer TMA and the touch control structure 106 are disposed on different layers. In some embodiments, FIG. 11 shows that the fourth touch control electrode $R_x$ is connected through the bridging layer TMA.

Figure 12:
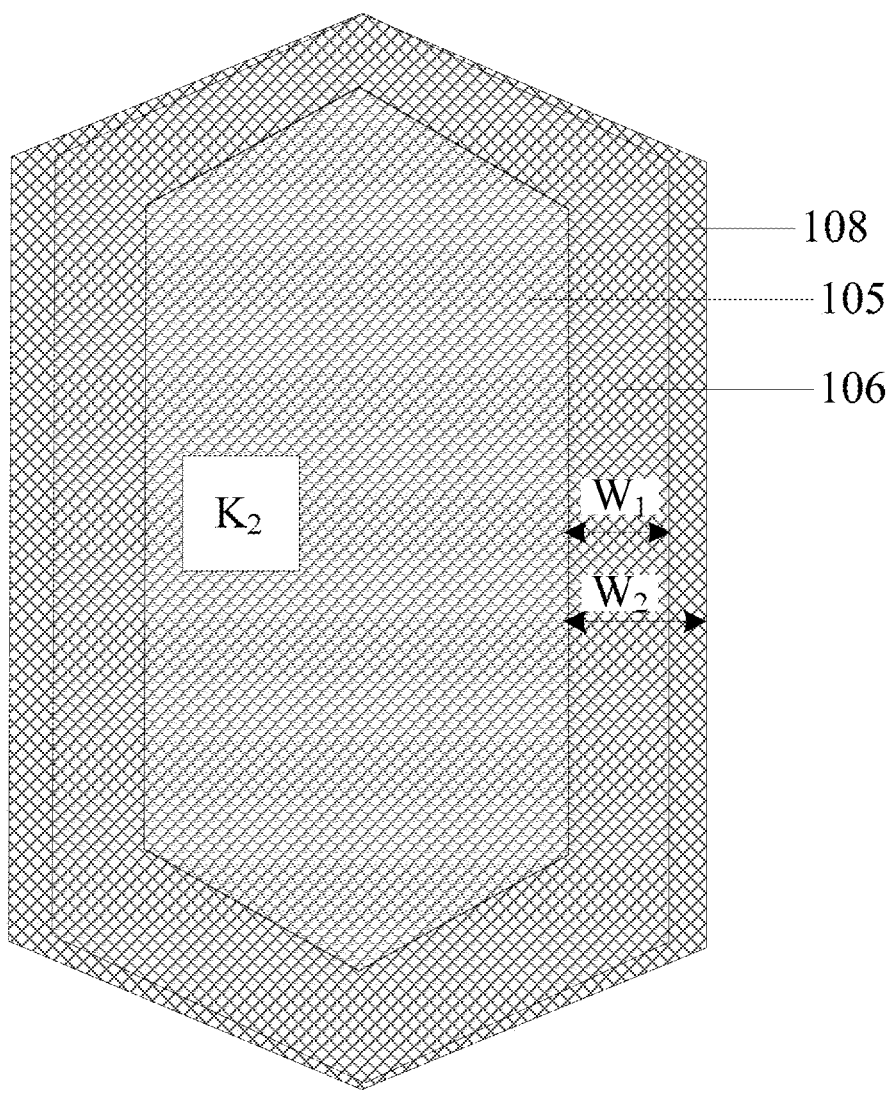
FIG. 12 is a relative position relationship diagram of a black matrix, a touch control structure and a first light shading layer provided by an embodiment of the present disclosure.

Optionally, in the above display substrate provided by an embodiment of the present disclosure, as shown in FIG. 12, in order to effectively keep away from the second openings $K_2$ of the black matrix 105, a grid line width $W_1$ of each of the third touch control electrode $T_x$ and the fourth touch control electrode $R_x$ may be in a range of 2 μm to 4 μm, for example, 2 μm, 3 μm, 4 μm, etc.

In order to improve a signal delay (RC delay) phenomenon, a metal material with a small resistance value is generally selected to manufacture the touch control structure 106. However, the touch control structure 106 is located on a film layer above the light emitting devices 102, therefore, transmitted light rays of the light emitting devices 102 may be reflected to the photosensitive devices 103 by the touch control structure 106, thereby interfering the fingerprint recognition.

Figure 13:
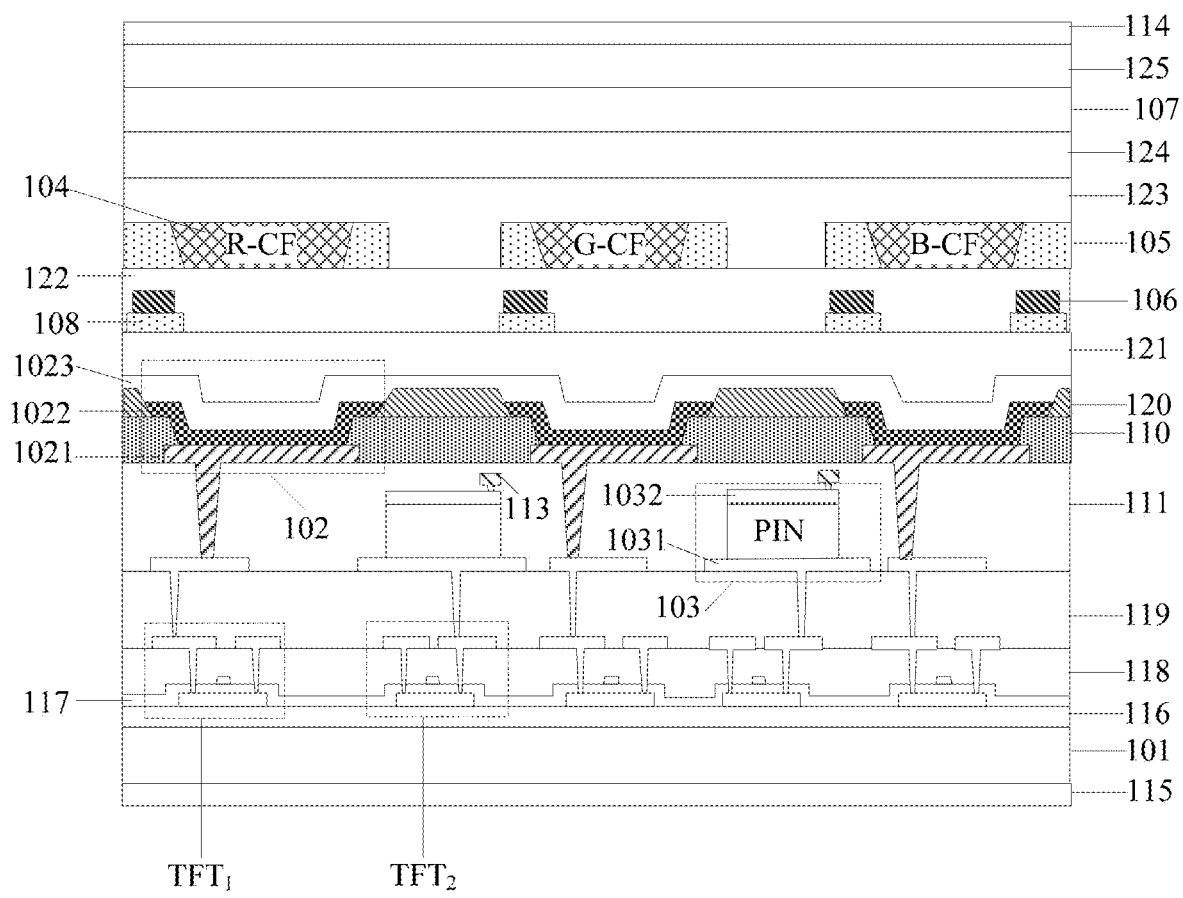
FIG. 13 is a schematic diagram of yet another sectional structure along a line I-II in FIG. 1.

Based on this, the above display substrate provided by an embodiment of the present disclosure, as shown in FIG. 13, may further include: a first light shading layer 108 located between the layer where the plurality of light emitting devices 102 are located and a layer where the touch control structure 106 is located, where an orthographic projection of the first light shading layer 108 on the base substrate 101 is greater than or equal to the orthographic projection of the touch control structure 106 on the base substrate 101 and smaller than the orthographic projection of the black matrix 105 on the base substrate 101, and the orthographic projection of the first light shading layer 108 on the base substrate 101 does not overlap with the orthographic projections of the second openings $K_2$ on the base substrate 101.

The first light shading layer 108 is located between the layer where the light emitting devices 102 are located and the layer where the touch control structure 106 is located, so that the transmitted light rays of the light emitting devices 102 can be effectively shielded, and the transmitted light rays of the light emitting devices 102 are prevented from being reflected by the touch control structure 106, thereby further improving the accuracy of fingerprint recognition. Furthermore, the first light shading layer 108 is located under the black matrix (BM) and keeps away from the second openings $K_2$, therefore, a display effect is not influenced, and a situation that the light rays reflected by the fingerprint are irradiated to the photosensitive devices 103 through the second openings $K_2$ is not influenced as well. In addition, it should be understood that the first light shading layer 108 is disposed to shield the touch control structure 106, and therefore, a pattern of the first light shading layer 108 and a pattern of the touch control structure 106 are the same or similar in shape.

In some embodiments, the first light shading layer 108 may adopt a material with a high absorbance (for example, black resin) or a material with extremely low reflectivity (for example, aluminum oxide).

Optionally, in the above display substrate provided by an embodiment of the present disclosure, as shown in FIG. 12, in order to effectively solve the problem that the touch control structure 106 reflects the transmitted light rays of the light emitting devices 102, a line width $W_2$ of the first light shading layer 108 may be set to be in a range of 2 μm to 5 μm, for example, 2 μm, 3 μm, 4 μm, 5 μm, etc.

Figure 14:
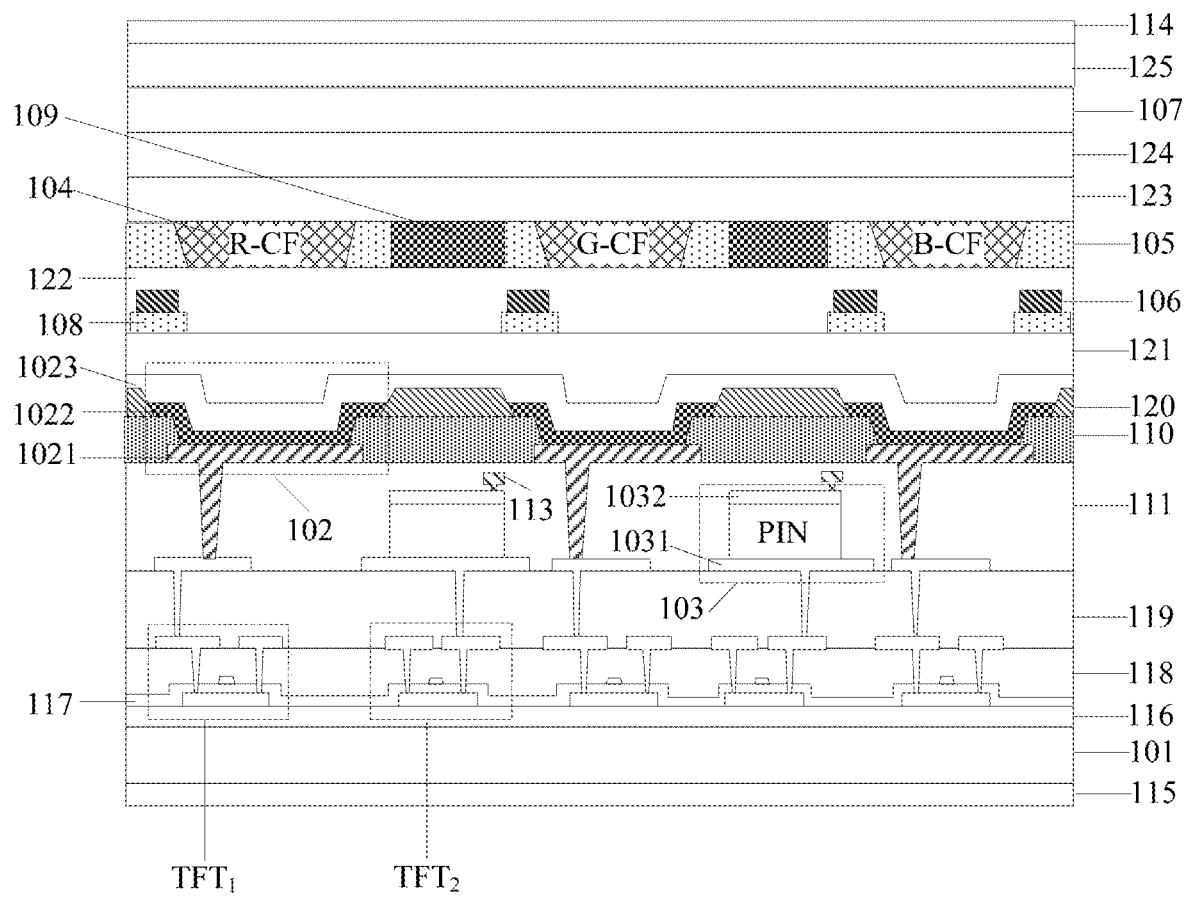
FIG. 14 is a schematic diagram of further sectional structure along a line I-II in FIG. 1.

Optionally, the above display substrate provided by an embodiment of the present disclosure, as shown in FIG. 14, may further include: a plurality of light filtering structures 109, where each of the second openings $K_2$ is internally provided with one of the light filtering structures 109, and a material of each of the light filtering structures 109 is green resin.

In the fingerprint recognition process, except that the light emitted by the light emitting devices 102 may be inducted by the photosensitive devices 103 after being reflected by the fingerprint, the photosensitive devices 103 may further induct ambient light incident through a finger. The ambient light may interfere with the fingerprint recognition of the photosensitive devices 103. For example, when the ambient light is irradiated over the finger, the ambient light may penetrate through the finger and excite biological tissue in the finger to emit pigment light, and the pigment light may interfere with the fingerprint recognition. Through detection, the pigment light mainly includes the light with a wave length of 600 nm or above. Therefore, the light filtering structures 109 located at the second openings $K_2$ may effectively avoid the influence of the ambient light by intercepting infrared light rays, thereby realizing the effect of accurate fingerprint recognition under an outdoor sunlight environment. In addition, the second openings $K_2$ are filled with green resin, equivalently, the green resin is adopted to replace an original black matrix material at the second openings $K_2$, so that an overall pattern at a region where the entire black matrix 105 is located is almost not changed, so that the emergent light rays of the adjacent color resistors 104 are advantageously prevented from crosstalk, and the display effect is good.

Optionally, the above display substrate provided by an embodiment of the present disclosure, as shown in FIG. 2 and FIG. 5, may further include: a pixel defining layer 110 located between a layer where first electrodes 1021 of the light emitting devices 102 are located and the layer where the black matrix 105 is located. A material of the pixel defining layer 110 may be green resin, and the pixel defining layer 110 has a plurality of third openings, and each of the third openings corresponds to one of the light emitting devices 102.

In the related art, a material with the high transmissivity such as polyimide and silicon nitride is generally adopted to manufacture the pixel defining layer 110. In the present disclosure, the green resin is adopted to manufacture the pixel defining layer 110, and based on the similar principle of the light filtering structures 109, the influence of the ambient light may be effectively avoided.

Furthermore, in some embodiments, the light filtering structures 109 and the pixel defining layer 110 made of the green resin may exist at the same time so as to dually intercept the infrared rays; or the light filtering structures 109 exist, and the pixel defining layer 110 is manufactured by adopting polyimide, silicon nitride or the like, so as to effectively intercept the infrared rays only through the light filtering structures 109; or the light filtering structures 109 are not disposed, and the pixel defining layer 110 is manufactured by adopting the green resin so as to effectively intercept the infrared rays only through the pixel defining layer 110. In addition, the line width of the pixel defining layer 110 may be reasonably set to prevent the display effect from being influenced by mutual interference of the transmitted light rays of the two adjacent light emitting devices 102.

Figure 15:
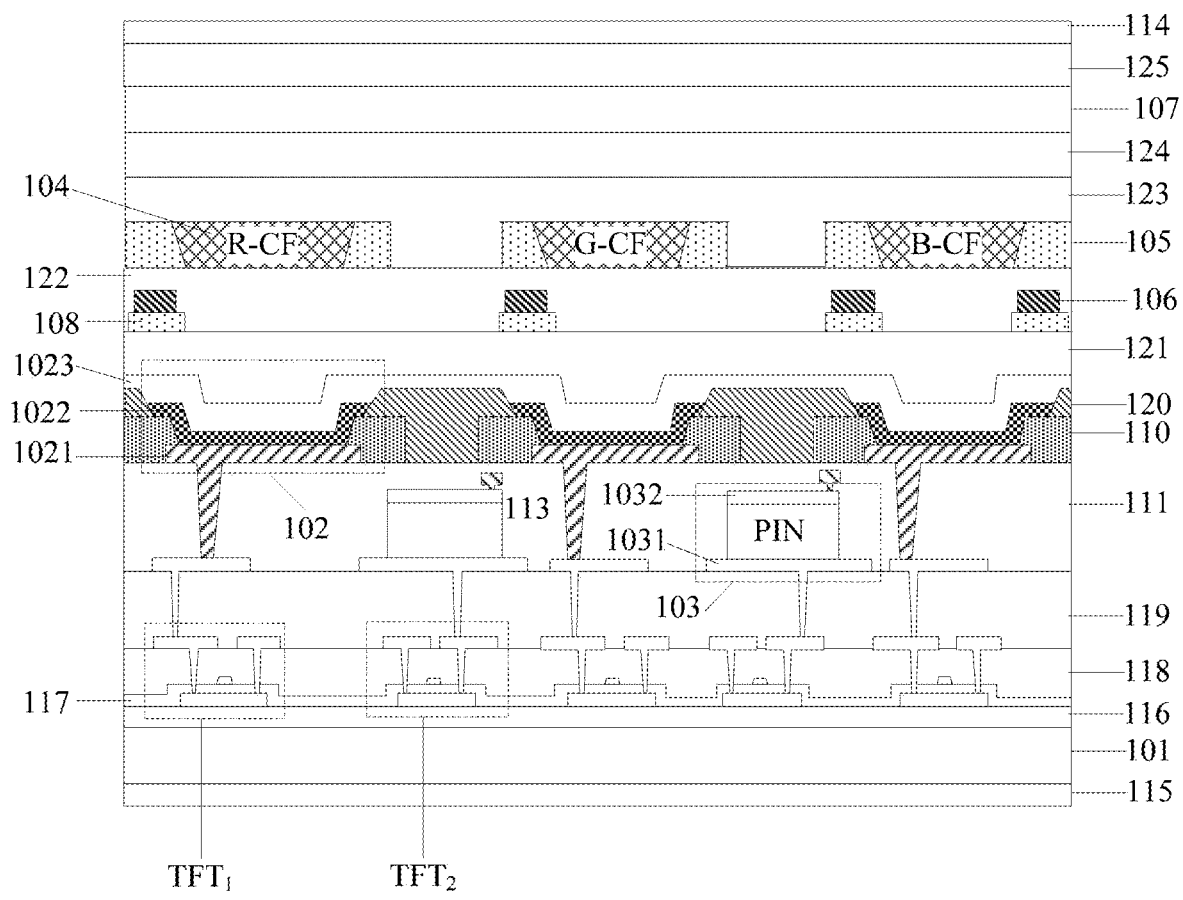
FIG. 15 is a schematic diagram of yet further sectional structure along a line I-II in FIG. 1.

Optionally, the above display substrate provided by an embodiment of the present disclosure, as shown in FIG. 15, may further include: a pixel defining layer 110 located between a layer where the first electrodes 1021 of the light emitting devices 102 are located and the layer where the black matrix 105 is located, where a material of the pixel defining layer 110 is black resin, and the pixel defining layer 110 has a plurality of third openings and a plurality of fourth openings; one of the light emitting devices 102 is disposed at each of the third openings, and each of the fourth openings corresponds to one of the second openings $K_2$; and an orthographic projection of each of the fourth openings on the base substrate 101 is located in the orthographic projection of the corresponding one of the second opening $K_2$ on the base substrate 101, and a center of the orthographic projection of each of the fourth openings on the base substrate 101 coincides with a center of the orthographic projection of the corresponding one of the second openings $K_2$ on the base substrate.

The pixel defining layer 110 manufactured by the black resin contains the fourth openings directly facing the second opening $K_2$ up and down, the fourth openings and the second opening $K_2$ may form a collimation effect on the light rays reflected by the fingerprint together, and a size of each of the fourth openings is smaller than a size of each of the second opening $K_2$, so that the fourth openings may effectively intercept large-angle interference light rays. Furthermore, the pixel defining layer 110 is manufactured by the black resin without newly adding a light shading layer, thereby reducing an overall thickness of a display device, further simplifying a manufacturing process, and improving production efficiency. In addition, the pixel defining layer 110 manufactured through the black resin may block mutual interference of the transmitted light rays of two adjacent light emitting devices 102 more effectively, therefore, the line width of the pixel defining layer 110 may be relatively small, thereby reducing an occupied area of the pixel defining layer 110, advantageously improving a pixel density, and increasing a resolution.

Figure 16:
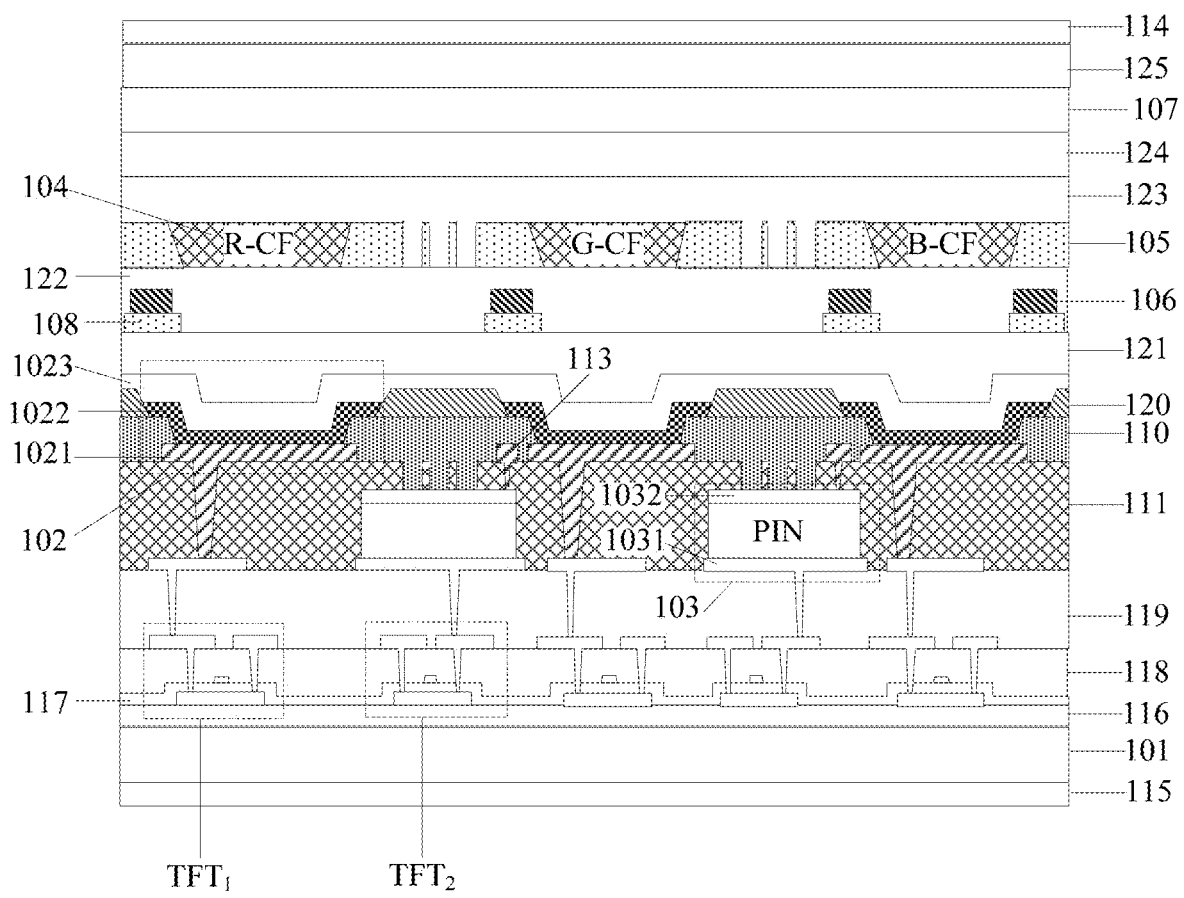
FIG. 16 is a schematic diagram of further another sectional structure along a line I-II in FIG. 1.

Optionally, the above display substrate provided by an embodiment of the present disclosure, as shown in FIG. 16, may further include: a first flat layer 111 located between the layer where the first electrodes 1021 of the light emitting devices 102 are located and the layer where the photosensitive devices 103 are located, where a material of the first flat layer 111 is black resin, the first flat layer 111 has a plurality of fifth openings, and each of the fifth openings corresponds to one of the second openings $K_2$; and an orthographic projection of each of the fifth openings on the base substrate 101 is located in the orthographic projection of the corresponding one of the second openings $K_2$ on the base substrate 101, and a center of the orthographic projection of each of the fifth openings on the base substrate 101 coincides with a center of the orthographic projection of the corresponding one of the second openings $K_2$ on the base substrate 101.

The first flat layer 111 manufactured by the black resin contains the fifth openings directly facing the second opening $K_2$ up and down, the fifth openings and the second opening $K_2$ may form the collimation effect on the light rays reflected by the fingerprint together, and a size of each of the fifth openings is smaller than the size of each of the second opening $K_2$, so that the fifth openings may effectively intercept large-angle interference light rays. The first flat layer 111 is manufactured by the black resin without newly adding a light shading layer, thereby reducing an overall thickness of a display product, further simplifying the manufacturing process, and improving the production efficiency.

Figure 17:
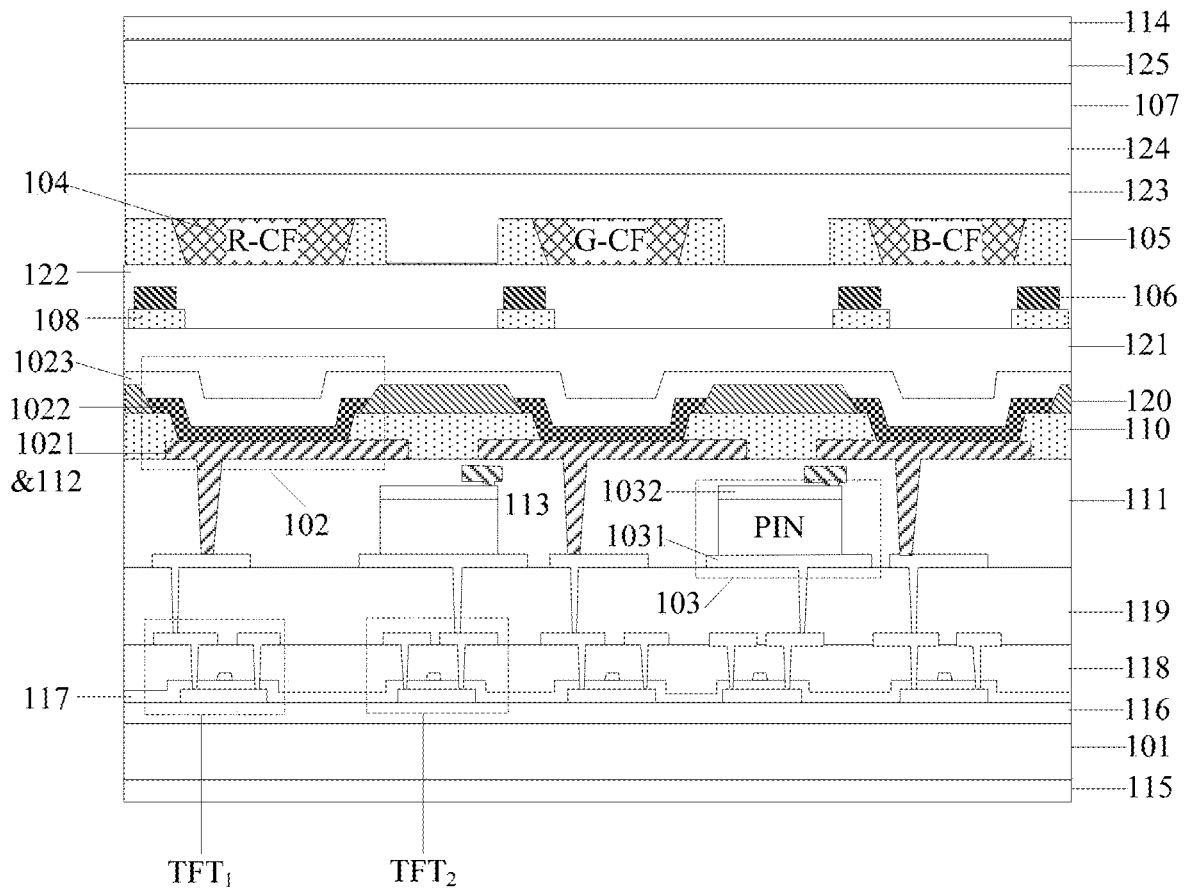
FIG. 17 is a schematic diagram of further another sectional structure along a line I-II in FIG. 1.
Figure 18:
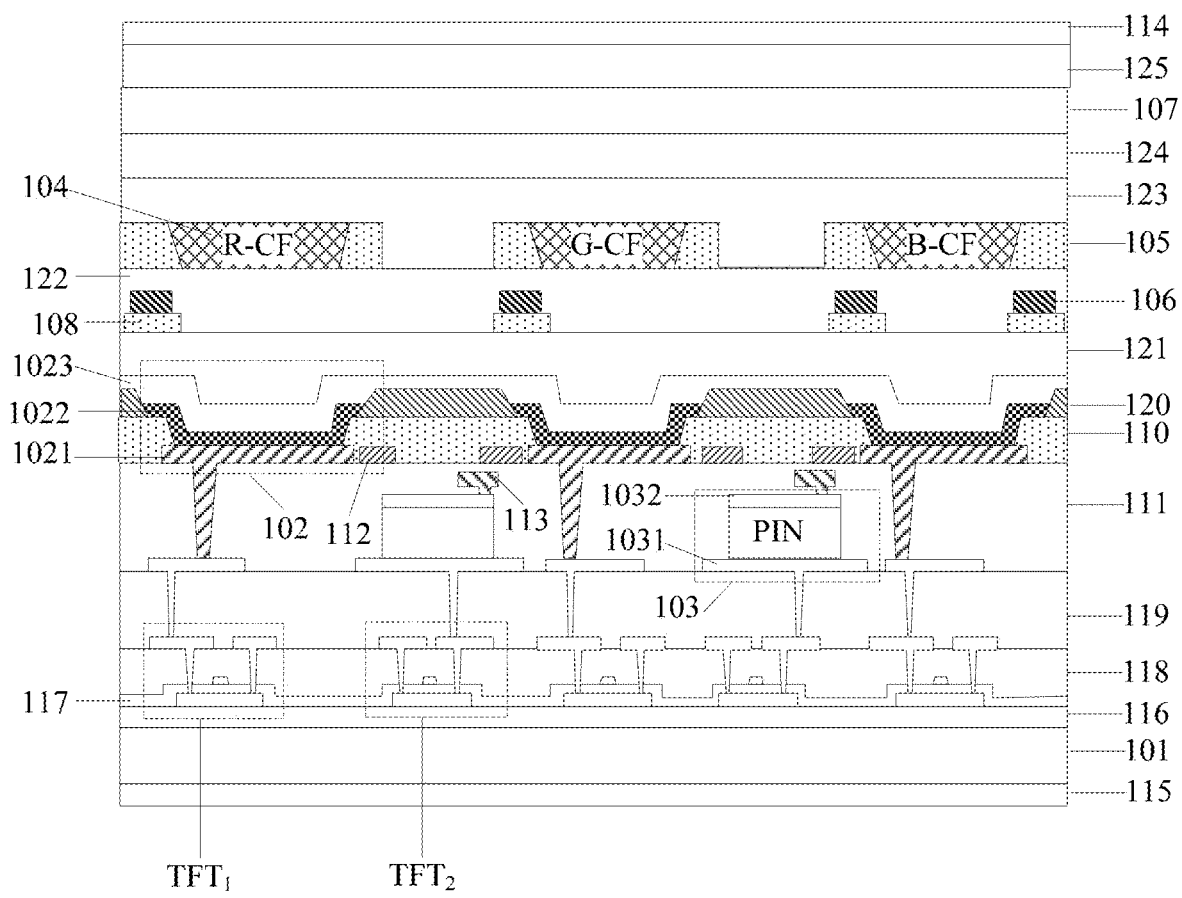
FIG. 18 is a schematic diagram of further another sectional structure along a line I-II in FIG. 1.
Figure 19:
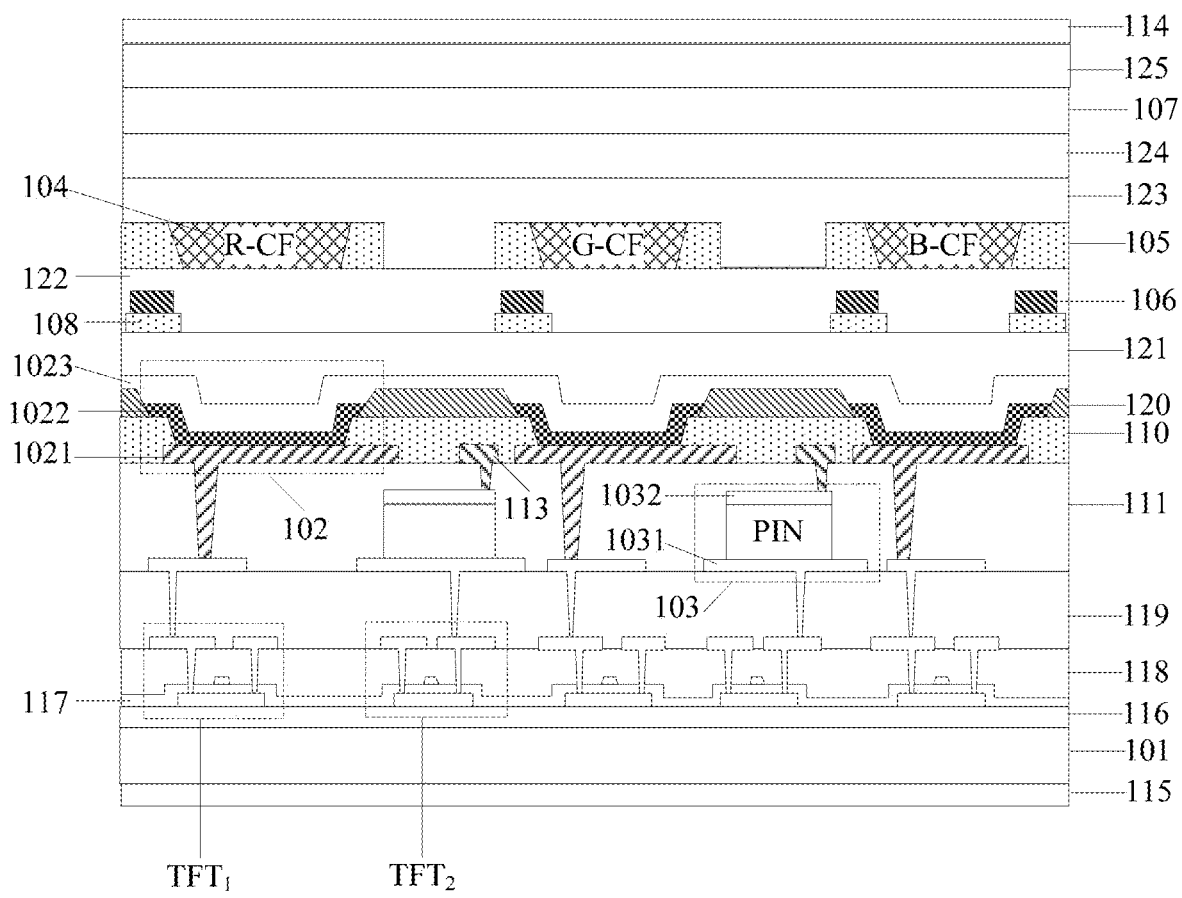
FIG. 19 is a schematic diagram of further another sectional structure along a line I-II in FIG. 1.

Optionally, the above display substrate provided by an embodiment of the present disclosure, as shown in FIG. 17 to FIG. 19, may further include: a second light shading layer 112 located between the layer where the photosensitive devices 103 are located and the layer where the black matrix 105 is located, where the second light shading layer 112 has a plurality of sixth openings, each of the sixth openings corresponds to one of the second openings $K_2$, an orthographic projection of each of the sixth openings on the base substrate 101 is located in the orthographic projection of the corresponding one of the second openings $K_2$ on the base substrate 101, and a center of the orthographic projection of each of the sixth openings on the base substrate 101 coincides with a center of the orthographic projection of the corresponding one of the second openings $K_2$ on the base substrate 101. The sixth openings formed under the second openings $K_2$ and the second openings $K_2$ may form the collimation effect on the light rays reflected by the fingerprint together, and a size of each of the sixth openings is smaller than a size of each of the second opening $K_2$, so that the sixth openings may effectively intercept large-angle interference light rays.

Optionally, in the above display substrate provided by an embodiment of the present disclosure, as shown in FIG. 17, the second light shading layer 112 may be multiplexed as the first electrodes 1021 of the light emitting devices 102, so as to avoid separately disposing of the second light shading layer 112, thereby decreasing the quantity of a film layer, and saving the production cost.

Optionally, the above display substrate provided by an embodiment of the present disclosure, as shown in FIG. 18, the second light shading layer 112 and the first electrodes 1021 of the light emitting devices 102 may be disposed on the same layer. In the present disclosure, "the same layer" refers to a layer structure formed in a mode that the film layer configured to manufacture a specific pattern is formed through the same film forming process, and then the same mask is adopted to form the layer structure through a one-time composition process. That is, the one-time composition process corresponds to one mask (also called a photomask). According to the different specific patterns, the one-time composition process may include multiple exposure, developing or etching processes, the specific patterns in the formed layer structure may be continuous or discontinuous, and these specific patterns may be at the same height or have the same thickness, or may be at different heights or have different thicknesses. It can be seen that in the case that the second light shading layer 112 and the first electrodes 1021 of the light emitting devices 102 are disposed on the same layer, the second light shading layer 112 may be prevented from being separately disposed, thereby reducing the film layer quantity and a mask process, advantageously realizing lighting-thinning design, and saving the cost.

Optionally, the above display substrate provided by an embodiment of the present disclosure, as shown in FIG. 19, may further include: a bias voltage layer 113 disposed on a same layer with first electrodes 1021 of the light emitting devices 102, where the bias voltage layer 113 is electrically with the plurality of photosensitive devices 103, and an orthographic projection of the bias voltage layer 113 on the base substrate 101 is located in the orthographic projection of the black matrix 105 on the base substrate 101; and the second light shading layer 112 is multiplexed as the first electrodes 1021 of the light emitting devices 102 and the bias voltage layer 113. In the case that the second light shading layer 112, the first electrodes 1021 of the light emitting devices 102 and the bias voltage layer 113 are multiplexed, the second light shading layer 112 may be prevented from being separately disposed, thereby reducing the film layer quantity and the mask process, advantageously realizing the lighting-thinning design, and saving the cost.

It should be noted that in some embodiments, as shown in FIG. 2, FIGS. 13-15, FIG. 17 and FIG. 18, the bias voltage layer 113 may further be located between the first electrodes 1021 of the light emitting devices 102 and the layer where the photosensitive devices 103 are located. In this case, in order to prevent the bias voltage layer 113 from blocking the light rays reflected by the fingerprint, the bias voltage layer 113 may be manufactured by adopting a transparent conductive material (for example, indium tin oxide, indium zinc oxide or the like).

Optionally, the above display substrate provided by an embodiment of the present disclosure may further include: a protective film 114 located on a side of the ultrathin glass cover plate 107 facing away from the base substrate 101, and the protective film 114 is a transparent polymer plastic film, and may include a transparent polyimide film (CPI) or a polyethylene terephthalate plastic film (PET). In some embodiments, the protective film 114 may further include the transparent polyimide film and a hard coating located on a side of the transparent polyimide film facing away from the ultrathin glass cover plate 107, the hard coating may be an acrylate material, and a thickness of the protective film 114 is about 60 μm.

Generally, the above display substrate provided by an embodiment of the present disclosure, as shown in FIG. 2, FIG. 5, FIGS. 13-19, may further include: a back film 115, a buffer layer 116, a gate insulating layer 117, an interlayer dielectric layer 118, a second flat layer 119, a spacer layer 120, an encapsulation layer 121, a second flat layer 122, a third flat layer 123, a first bonding layer 124, a second bonding layer 125, a first transistor $TFT_1$, a second transistor $TFT_2$, etc. It should be understood by those skilled in the art that the display substrate should have other essential constituent parts, which is not repeated here and may also not be regarded as limitation to the present disclosure.

Based on the same inventive concept, the present disclosure further provides a display device, including the above display substrate provided by embodiments of the present disclosure. The display substrate may be an OLED display substrate. Principles of the display device for solving the problems are similar to that of the above display substrate, so that implementation of the display device may refer to that of the above display substrate, which is not repeated here.

In some embodiment, the above display device provided by embodiments of the present disclosure may be: any product or component with a display function, such as a mobile phone, a tablet computer, a television, a displayer, a notebook computer, a digital photo frame, a navigation instrument, a smart watch, a fitness wristband, and a personal digital assistant. The display device provided by an embodiment of the present disclosure may further include but not limited to: a radio frequency unit, a network module, an audio output unit, an input unit, a sensor, a display unit, a user input unit, an interface unit, a memory, a processor, a power source and other parts. It may be understood by those skilled in the art that constitution of the above display device does not constitute limitation to the display device, and the display device may include the above more or less parts, or combine the certain parts, or include different part arrangements.

Apparently, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display substrate, comprising:
    a base substrate;
    a plurality of light emitting devices, located on the base substrate;
    a plurality of photosensitive devices, located between a layer where the plurality of light emitting devices are located and the base substrate, wherein an orthographic projection of each of the photosensitive devices on the base substrate is located at a gap between orthographic projections of adjacent light emitting devices on the base substrate;
    a plurality of color resistors and a black matrix, located on a side of the layer where the plurality of light emitting devices are located facing away from the base substrate, wherein the black matrix has a plurality of first openings and a plurality of second openings, the plurality of color resistors are correspondingly disposed in the plurality of first openings and cover the plurality of light emitting devices, and orthographic projections of the plurality of second openings on the base substrate mutually overlap with the orthographic projections of the plurality of photosensitive devices on the base substrate;
    a touch control structure, located between the layer where the plurality of light emitting devices are located and a layer where the black matrix is located, wherein an orthographic projection of the touch control structure on the base substrate is located in an orthographic projection of the black matrix on the base substrate, and the orthographic projection of the touch control structure on the base substrate does not overlap with the orthographic projections of the second openings on the base substrate; and
    an ultrathin glass cover plate, a whole face of which being disposed on a side of the layer where the black matrix is located facing away from the base substrate;
    wherein at least one of the second openings and one of the photosensitive devices are correspondingly disposed;
    wherein one of the second openings and one of the photosensitive devices are correspondingly disposed, and the orthographic projection of the one of the second openings on the base substrate completely coincides with the orthographic projection of the corresponding one of the photosensitive devices on the base substrate; and
    wherein a light receiving angle θ determined by the black matrix meets a following relationship: $\tan \theta = d/h_2 = P_x/(2h_1)$, wherein d is a pore diameter of the one of the second openings, $h_1$ is a distance between the ultrathin glass cover plate and the layer where the black matrix is located, $h_2$ is a distance between the layer where the black matrix is located and a layer where the photosensitive devices are located, and $P_x$ is a distance between adjacent ridges or adjacent valleys of a fingerprint.

2. The display substrate according to claim 1, wherein d is in a range of 8 μm to 20 μm, $h_1$ is in a range of 50 μm to 200 μm, $h_2$ is in a range of 8 μm to 20 μm, $P_x$ is in a range of 300 μm to 500 μm, and θ is in a range of 30° to 50°.

3. The display substrate according to claim 2, wherein a distance between centers of adjacent second openings is in a range of 20 μm to 80 μm.

4. The display substrate according to claim 1, wherein the touch control structure comprises: a plurality of first touch control electrodes arranged in an array, a plurality of second touch control electrode groups arranged in an array, a plurality of first touch control lines electrically connected with the plurality of first touch control electrodes, and a plurality of second touch control lines electrically connected with the plurality of second touch control electrode groups; wherein
    the plurality of first touch control electrodes, the plurality of second touch control electrode groups, the plurality of first touch control lines and the plurality of second touch control lines are disposed on a same layer;
    each column of the first touch control electrodes and each column of the second touch control electrode groups are alternately disposed, and a length of each of the first touch control electrodes in a column direction is equal to a length of each of the second touch control electrode groups in the column direction;
    the plurality of first touch control lines are located on a same side of the first touch control electrodes in the column direction, and each of the first touch control lines is electrically connected with one of the first touch control electrodes;
    the plurality of second touch control lines are located on two sides of the second touch control electrode groups in the column direction and in a gap of adjacent second touch control electrode groups in the column direction, and the plurality of second touch control lines comprise a plurality of first sub touch control lines, a plurality of second sub touch control lines, a plurality of third sub touch control lines and a plurality of fourth sub touch control lines; and each of the second touch control electrode groups comprises a first sub touch control electrode, a second sub touch control electrode, a third sub touch control electrode and a fourth sub touch control electrode arranged sequentially in the column direction, adjacent first sub touch control electrodes in a column of the second touch control electrode groups are electrically connected through one of the first sub touch control lines, adjacent second sub touch control electrodes in a column of the second touch control electrode groups are electrically connected through one of the second sub touch control lines, adjacent third sub touch control electrodes in a column of the second touch control electrode groups are electrically connected through one of the third sub touch control lines, and adjacent fourth sub touch control electrodes in a column of the second touch control electrode groups are electrically connected through one of the fourth sub touch control lines.

5. The display substrate according to claim 1, wherein the touch control structure comprises a third touch control electrode extending in a column direction, and a fourth touch control electrode extending in a row direction; and the third touch control electrode and the fourth touch control electrode are in a grid shape, and the third touch control electrode and the fourth touch control electrode are disposed on a same layer.

6. The display substrate according to claim 5, wherein a grid line width of each of the third touch control electrode and the fourth touch control electrode is in a range of 2 μm to 4 μm.

7. The display substrate according to claim 1, further comprising: a first light shading layer located between the layer where the plurality of light emitting devices are located and a layer where the touch control structure is located, wherein an orthographic projection of the first light shading layer on the base substrate is greater than or equal to the orthographic projection of the touch control structure on the base substrate and smaller than the orthographic projection of the black matrix on the base substrate, and the orthographic projection of the first light shading layer on the base substrate does not overlap with the orthographic projections of the second openings on the base substrate.

8. The display substrate according to claim 7, wherein a line width of the first light shading layer is in a range of 2 μm to 5 μm.

9. The display substrate according to claim 1, further comprising: a plurality of light filtering structures, wherein each of the second openings is internally provided with one of the light filtering structures, and a material of each of the light filtering structures is green resin.

10. The display substrate according to claim 1, further comprising: a pixel defining layer located between a layer where first electrodes of the light emitting devices are located and the layer where the black matrix is located, wherein a material of the pixel defining layer is black resin, and the pixel defining layer has a plurality of third openings and a plurality of fourth openings; and one of the light emitting devices is disposed at each of the third openings, and each of the fourth openings corresponds to one of the second openings; and an orthographic projection of each of the fourth openings on the base substrate is located in the orthographic projection of the corresponding one of the second openings on the base substrate, and a center of the orthographic projection of each of the fourth openings on the base substrate coincides with a center of the orthographic projection of the corresponding one of the second openings on the base substrate.

11. The display substrate according to claim 1, further comprising: a pixel defining layer located between a layer where first electrodes of the light emitting devices are located and the layer where the black matrix is located, wherein a material of the pixel defining layer is green resin, the pixel defining layer has a plurality of third openings, and each of the third openings corresponds to one of the light emitting devices.

12. The display substrate according to claim 1, further comprising: a first flat layer located between a layer where first electrodes of the light emitting devices are located and the layer where the photosensitive devices are located, wherein a material of the first flat layer is black resin, the first flat layer has a plurality of fifth openings, and each of the fifth openings corresponds to one of the second openings; and an orthographic projection of each of the fifth openings on the base substrate is located in the orthographic projection of the corresponding one of the second openings on the base substrate, and a center of the orthographic projection of each of the fifth openings on the base substrate coincides with a center of the orthographic projection of the corresponding one of the second openings on the base substrate.

13. The display substrate according to claim 1, further comprising: a second light shading layer located between the layer where the photosensitive devices are located and the layer where the black matrix is located, wherein the second light shading layer has a plurality of sixth openings, each of the sixth openings corresponds to one of the second openings, an orthographic projection of each of the sixth openings on the base substrate is located in the orthographic projection of the corresponding one of the second openings on the base substrate, and a center of the orthographic projection of each of the sixth openings on the base substrate coincides with a center of the orthographic projection of the corresponding one of the second openings on the base substrate.

14. The display substrate according to claim 13, wherein the second light shading layer is multiplexed as first electrodes of the light emitting devices.

15. The display substrate according to claim 13, wherein the second light shading layer and first electrodes of the light emitting devices are disposed on a same layer.

16. The display substrate according to claim 13, further comprising: a bias voltage layer disposed on a same layer with first electrodes of the light emitting devices, wherein the bias voltage layer is electrically with the plurality of photosensitive devices, and an orthographic projection of the bias voltage layer on the base substrate is located in the orthographic projection of the black matrix on the base substrate; and the second light shading layer is multiplexed as the first electrodes of the light emitting devices and the bias voltage layer.

17. A display device, comprising a display substrate, wherein the display substrate comprises:
- a base substrate;
- a plurality of light emitting devices, located on the base substrate;
- a plurality of photosensitive devices, located between a layer where the plurality of light emitting devices are located and the base substrate, wherein an orthographic projection of each of the photosensitive devices on the base substrate is located at a gap between orthographic projections of adjacent light emitting devices on the base substrate;
- a plurality of color resistors and a black matrix, located on a side of the layer where the plurality of light emitting devices are located facing away from the base substrate, wherein the black matrix has a plurality of first openings and a plurality of second openings, the plurality of color resistors are correspondingly disposed in the plurality of first openings and cover the plurality of light emitting devices, and orthographic projections of the plurality of second openings on the base substrate mutually overlap with the orthographic projections of the plurality of photosensitive devices on the base substrate;
- a touch control structure, located between the layer where the plurality of light emitting devices are located and a layer where the black matrix is located, wherein an orthographic projection of the touch control structure on the base substrate is located in an orthographic projection of the black matrix on the base substrate, and the orthographic projection of the touch control structure on the base substrate does not overlap with the orthographic projections of the second openings on the base substrate; and
- an ultrathin glass cover plate, a whole face of which being disposed on a side of the layer where the black matrix is located facing away from the base substrate;
- wherein at least one of the second openings and one of the photosensitive devices are correspondingly disposed;
- wherein one of the second openings and one of the photosensitive devices are correspondingly disposed, and the orthographic projection of the one of the second openings on the base substrate completely coincides with the orthographic projection of the corresponding one of the photosensitive devices on the base substrate; and
- wherein a light receiving angle $\theta$ determined by the black matrix meets a following relationship: $\tan \theta = d/h_2 = P_x/(2h_1)$, wherein d is a pore diameter of the one of the second openings, $h_1$ is a distance between the ultrathin glass cover plate and the layer where the black matrix is located, $h_2$ is a distance between the layer where the black matrix is located and a layer where the photosensitive devices are located, and $P_x$ is a distance between adjacent ridges or adjacent valleys of a fingerprint.

* * * * *